(12) United States Patent
Henneck et al.

(10) Patent No.: US 9,627,335 B2
(45) Date of Patent: Apr. 18, 2017

(54) METHOD FOR PROCESSING A SEMICONDUCTOR WORKPIECE AND SEMICONDUCTOR WORKPIECE

(71) Applicant: Infineon Technologies AG, Neubiberg (DE)

(72) Inventors: Stephan Henneck, Regensburg (DE); Evelyn Napetschnig, Diex (AT); Daniel Pedone, Munich (DE); Bernhard Weidgans, Bernhardswald (DE); Simon Faiss, Regenstauf (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 14/272,535

(22) Filed: May 8, 2014

(65) Prior Publication Data

US 2015/0325535 A1    Nov. 12, 2015

(51) Int. Cl.
*H01L 21/4763* (2006.01)
*H01L 23/00* (2006.01)

(52) U.S. Cl.
CPC ............... *H01L 24/05* (2013.01); *H01L 24/03* (2013.01); *H01L 2224/0345* (2013.01); *H01L 2224/03424* (2013.01); *H01L 2224/03464* (2013.01); *H01L 2224/03472* (2013.01); *H01L 2224/03614* (2013.01); *H01L 2224/05007* (2013.01); *H01L 2224/05027* (2013.01); *H01L 2224/05082* (2013.01); *H01L 2224/05155* (2013.01); *H01L 2224/05558* (2013.01); *H01L 2224/05583* (2013.01); *H01L 2224/05639* (2013.01); *H01L 2224/05644* (2013.01)

(58) Field of Classification Search
CPC ............ H01L 24/05; H01L 2224/0345; H01L 2224/03464
See application file for complete search history.

(56) References Cited

U.S. PATENT DOCUMENTS

| | | | | |
|---|---|---|---|---|
| 4,182,781 A * | 1/1980 | Hooper | ................... | H01L 24/11 205/126 |
| 5,225,360 A * | 7/1993 | Shim | ................. | H01L 29/66878 257/E21.454 |
| 6,436,816 B1 * | 8/2002 | Lee | ......................... | C23C 18/36 257/E21.174 |
| 2012/0013011 A1 * | 1/2012 | Hampp | .................. | H01L 24/05 257/762 |
| 2015/0132941 A1 * | 5/2015 | Liu | ..................... | H01L 23/5329 438/614 |

* cited by examiner

*Primary Examiner* — Bradley K Smith
(74) *Attorney, Agent, or Firm* — Viering, Jentschura & Partner mbB (57) ABSTRACT

A method for processing a semiconductor device in accordance with various embodiments may include: depositing a first metallization layer over a semiconductor workpiece; patterning the first metallization layer; and depositing a second metallization layer over the patterned first metallization layer, wherein depositing the second metallization layer includes an electroless deposition process including immersing the patterned first metallization layer in a metal electrolyte.

17 Claims, 9 Drawing Sheets

METHOD FOR PROCESSING A SEMICONDUCTOR WORKPIECE AND SEMICONDUCTOR WORKPIECE

TECHNICAL FIELD

Various embodiments relate to a method for processing a semiconductor workpiece and a semiconductor workpiece.

BACKGROUND

Solderable and/or sinterable surfaces may be needed in semiconductor devices, e.g., as pad metallizations to make electrical connections to and/or from the devices. Low surface roughness, high corrosion resistance, low level of contamination, and/or easy processability may be among the properties that may be desirable in a material or materials forming the solderable and/or sinterable surfaces.

SUMMARY

In accordance with various embodiments, a method for processing a semiconductor workpiece may include: depositing a first metallization layer over a semiconductor workpiece; patterning the first metallization layer; and depositing a second metallization layer over the patterned first metallization layer, wherein depositing the second metallization layer includes an electroless deposition process including immersing the patterned first metallization layer in a metal electrolyte.

In accordance with various embodiments, a method for processing a semiconductor workpiece may include: depositing a metallization layer stack including at least two metallization layers over a semiconductor workpiece by means of physical vapor deposition; patterning the metallization layer stack by means of wet-chemical etching; and depositing a final metallization layer over the patterned metallization layer stack by means of immersion deposition.

In accordance with various embodiments, a semiconductor workpiece may include: a patterned first metallization layer; a second metallization layer covering a top side and at least one sidewall of the patterned first metallization layer, wherein the second metallization layer is formed by means of an electroless deposition process including immersing the patterned first metallization layer in a metal electrolyte.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc.

The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupling" or "connection" may be understood to include both the case of a direct "coupling" or "connection" and the case of an indirect "coupling" or "connection".

Nowadays, solderable and sinterable surfaces may be frequently based on final silver (Ag) layers on a substrate. Firstly, silver may be used as a protection layer for an underlying solderable nickel or nickel vanadium (NiV) layer which tends to oxidize very fast. Secondly, silver may be used as a noble interface for the material that is sintered later. For both applications, the surface may need a high level of purity and uniformity. Unfortunately, there may be a risk that silver will be oxidized and/or sulfidized. Furthermore, silver may be susceptible to contaminants, e.g. sulfur or halogenides. Also, especially the sintering process in an oxygen containing furnace or press may lead to interdiffusion of oxygen at the NiV—Ag interface and delamination of the layers already at low stress state.

Bonding pads for high temperature applications may frequently be based on gold (Au) based pads to overcome reliability issues like so-called Kirkendall voiding between pad and wire. One method to deposit NiP/Pd/Au or NiP/Au layers on Cu or Al substrates may be electroless plating. Electroless plating may have a high selectivity for Cu or Al pads, so that it may not need any further lithography. However, electroless plating may be sensitive towards contaminations of the initial pad, which may result in process difficulties and/or increased effort in maintaining the chemical baths for electroless plating.

Based on the above it may be recommendable to use gold as final layer due to the fact that it may not be susceptible to oxygen or other elements. However, the patterning of gold metallizations may be difficult. Due to its high corrosion resistance gold may only be etched with very aggressive media, e.g. aqua regia. Other deposition methods like lift-off based techniques may generate a high waste of noble metal and may cause high costs for recycling and equipment cleaning.

Today, solderable and sinterable surfaces for semiconductors may frequently include or consist of pad metallization stacks having a final Ag layer, for example Ti/NiV/Ag based pad metallizations. These metallizations may be deposited via sputtering or evaporation and may deliver very uniform, smooth layers. Patterning may be carried out via, e.g., a) lift-off or b) wet-chemical etching.

Figure 5A:
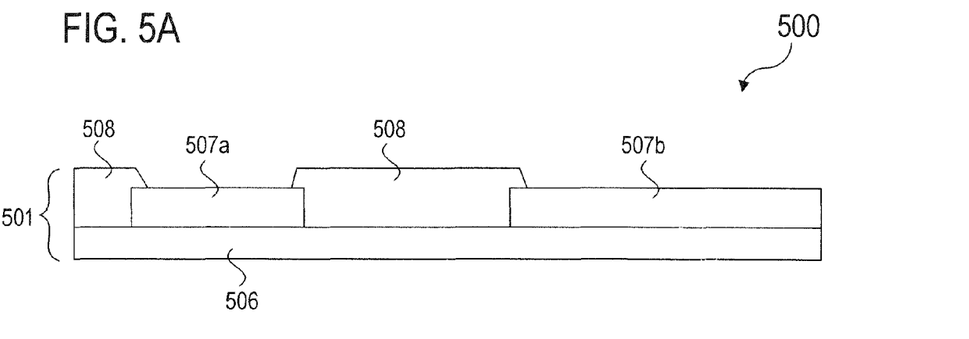
FIG. 5A to 5D illustrate a conventional process flow for obtaining a structured solderable surface using a lift-off process.
Figure 5B:
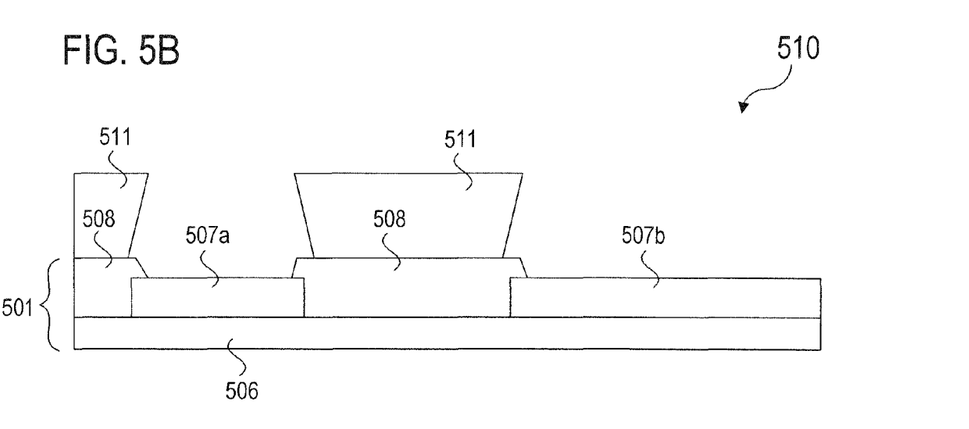
Figure 5C:
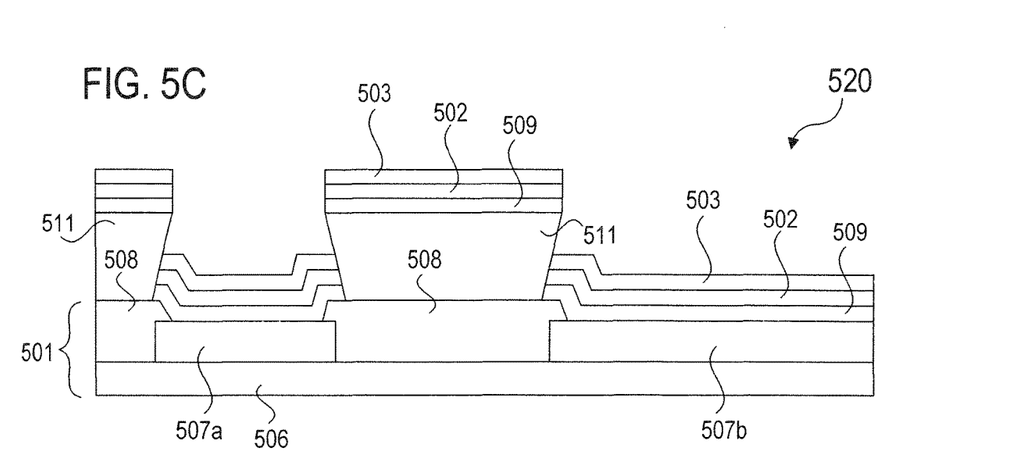
Figure 5D:
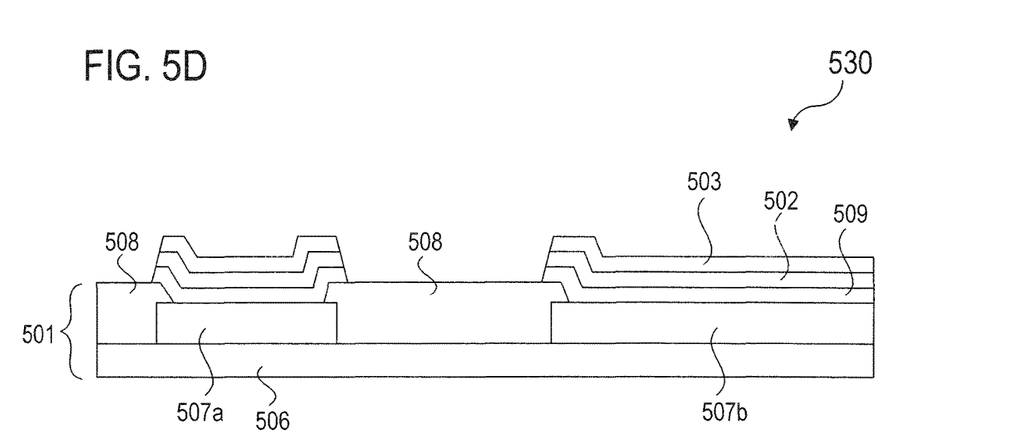

For method a) the metallization may be deposited on a resist to pattern the substrate, as is illustrated in FIG. 5A to 5D, which show, as an example, provision of a semiconductor workpiece, e.g. a wafer, 501 including an insulating layer, e.g. an oxide layer, 506, a first contact pad, e.g. a gate pad, 507a and a second contact pad, e.g. a source pad, 507b made of, e.g., aluminum, and an adhesion and/or passivation layer, e.g. an imide layer, 508 disposed over the insulating layer 506 and between the contact pads 507a, 507b and partially covering the contact pads 507a, 507b (see cross-sectional view 500 in FIG. 5A), deposition of a resist 511 over the wafer 501 and patterning of the resist 511 to expose the contact pads 507a, 507b (see cross-sectional view 510 in FIG. 5B), deposition of a metallization layer stack 509/502/503 via sputtering over the exposed contact pads 507a, 507b and remaining portions of the resist 511, the metallization layer stack 509/502/503 stack including a titanium (Ti) layer 509 as a diffusion bather, a nickel vanadium (NiV) layer 502 as a solder interface, and a final silver (Ag) layer 503 as a protection layer (see cross-sectional view 520 in FIG. 5C), and resist removal and metal lift-off (see cross-sectional view 530 in FIG. 5D).

Figure 6A:
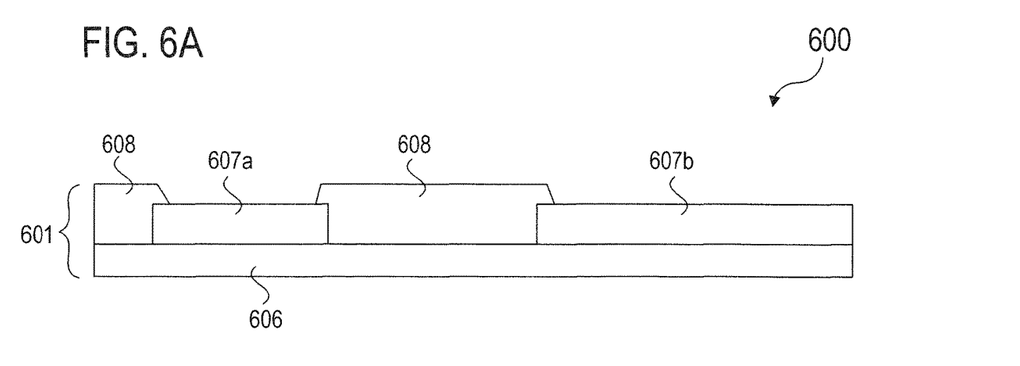
FIG. 6A to 6D illustrate a conventional process flow for obtaining a structured solderable surface using wet-chemical etching.
Figure 6B:
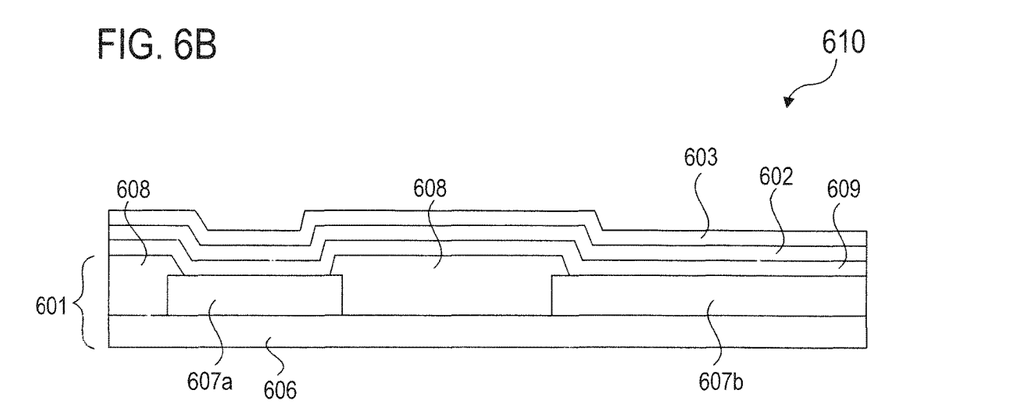
Figure 6C:
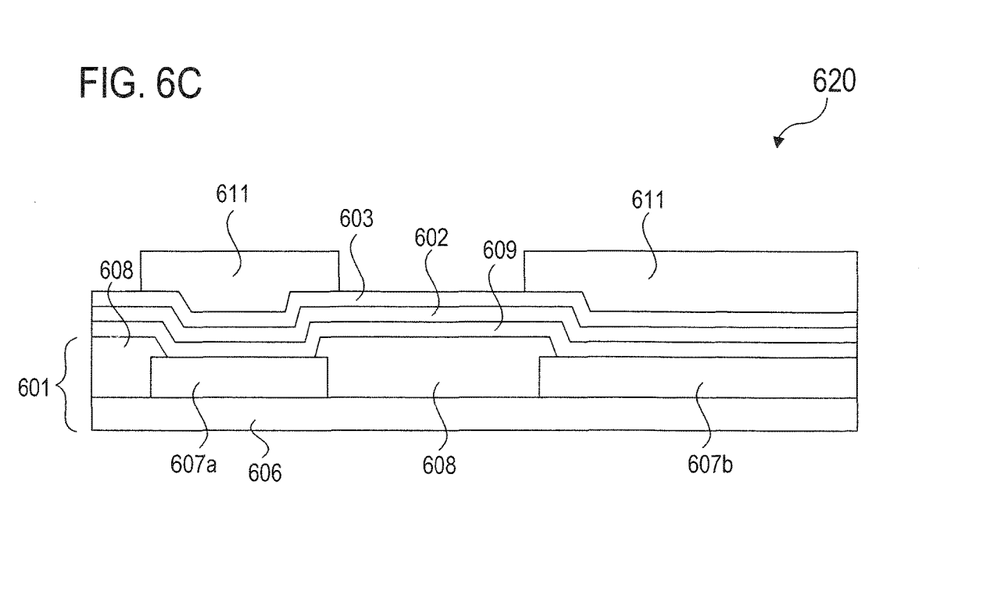
Figure 6D:
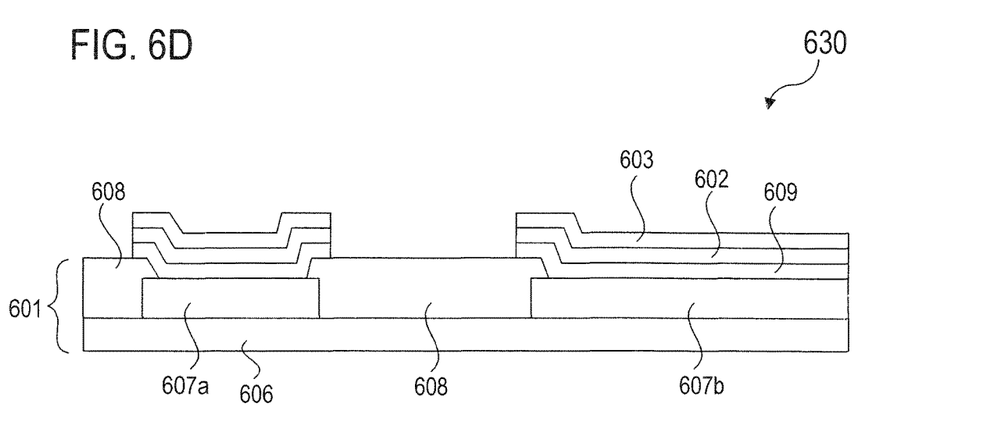

For method b), i.e. wet-chemical structuring, the resist may usually be deposited after the metallization and thus generates no outgassing of the resist, as is illustrated in FIG. 6A to 6D, which show, as an example, provision of a wafer 601 including an insulating layer, .g. an oxide layer, 606, a first contact pad, e.g. a gate pad, 607a and a second contact pad, e.g. a source pad, 607b, and an adhesion and/or passivation layer, e.g. an imide layer, 608 disposed over the insulating layer 606 and between the contact pads 607a, 607b and partially covering the contact pads 607a, 607b (see cross-sectional view 600 in FIG. 6A), deposition of a metallization layer stack 609/602/603 via sputtering over the contact pads 607a, 607b and the adhesion and/or passivation layer 608, the metallization layer stack 609/602/603 including a titanium (Ti) layer 609 as a diffusion bather, a nickel vanadium (NiV) layer 602 as a solder interface, and a final silver (Ag) layer 603 as a protection layer (see cross-sectional view 610 in FIG. 6B), deposition of a resist 611 over the metallization layer stack 609/602/603 and patterning of the resist 611 to expose portions of the metallization layer stack 609/602/603 other than those corresponding to the contact pads 607a, 607b (see cross-sectional view 620 in FIG. 6C), and wet-chemical etching of the exposed portions of the metallization layer stack 609/602/603 and resist removal (see cross-sectional view 630 in FIG. 6D).

In the above-described process flow using wet-chemical etching, the pad edge may show different etch rates for the three metals, which may result in an undercut of the less noble metal Ni and the noble metal Ag. An alternative could be, e.g., electroless deposition of NiP/Au. For this method it may not be necessary to use a resist mask for patterning due to the high selectivity of the process. However, the deposited layer may have worse uniformity compared to sputter/evaporation processes, which may result in a rougher surface mainly caused by the NiP layer. Very high surface roughness may lead to a worse diffusion barrier quality of the noble metal layer and thus to surface contamination by diffusion of the underlying NiP. This Ni can oxidize thereafter and can negatively affect a later connection process.

Figure 1A:
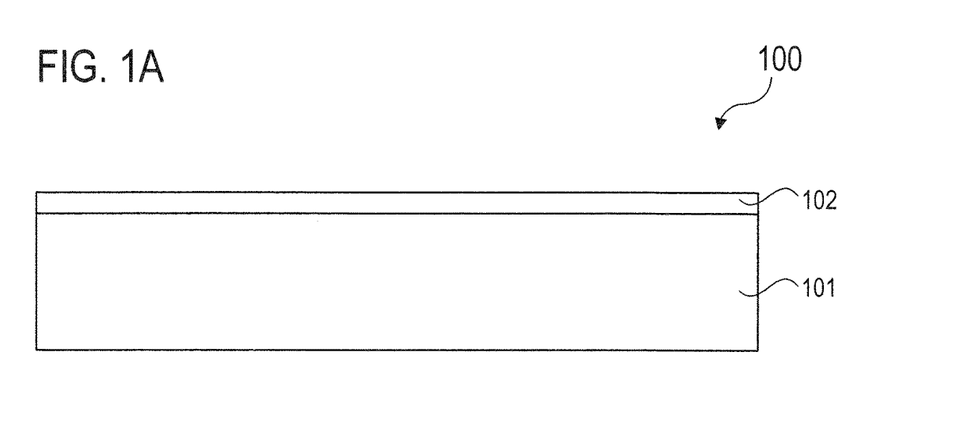
FIG. 1A to 1C illustrate a method for processing a semiconductor workpiece in accordance with various embodiments.
Figure 1B:
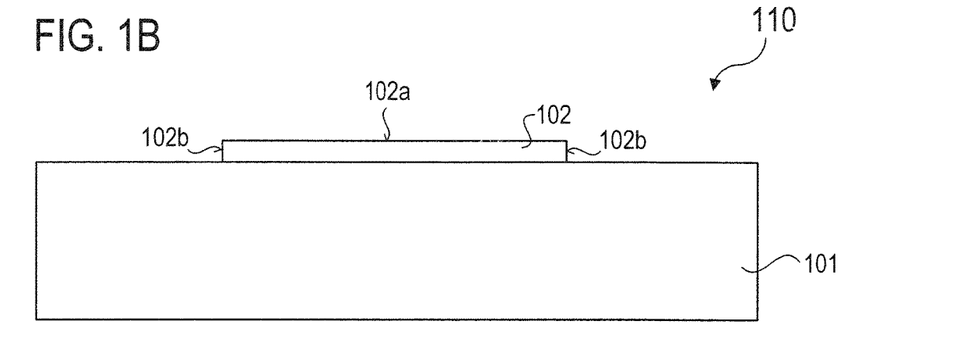
Figure 1C:
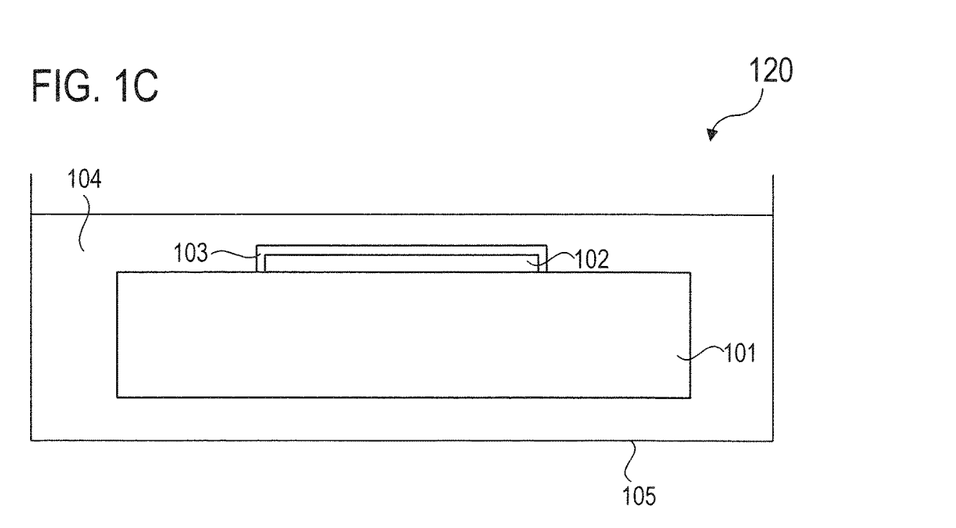

FIGS. 1A to 1C illustrate a method for processing a semiconductor workpiece in accordance with various embodiments.

The method may include: depositing a first metallization layer 102 over a semiconductor workpiece 101 (see cross-sectional view 100 in FIG. 1A), patterning the first metallization layer 102 (see cross-sectional view 110 in FIG. 1B); and depositing a second metallization layer 103 over the patterned first metallization layer 102, wherein depositing the second metallization layer 103 includes an electroless deposition process including immersing the patterned first metallization layer 102 in a metal electrolyte 104 (see cross-sectional view 120 in FIG. 1C).

In one or more embodiments, depositing the first metallization layer 102 may include or may be achieved by a vapor deposition process.

In one or more embodiments, the vapor deposition process may include or may be at least one of the following: a physical vapor deposition process (e.g., a sputter deposition process or an evaporation process), or a chemical vapor deposition process.

In accordance with other embodiments, other deposition processes may be applied to deposit the first metallization layer 102, for example a plating process including e.g. covering the surface of the workpiece with metal and patterning (e.g., wet-chemically patterning) the metal.

In one or more embodiments, the first metallization layer 102 may have a thickness in the range from about 5 nm to about 200 μm, e.g. in the range from about 50 nm to about 100 μm, e.g. a thickness of about 500 nm, although other thicknesses may be possible as well.

In one or more embodiments, the electroless deposition process may also be referred to as electroless plating.

In one or more embodiments, immersing the patterned first metallization layer 102 in the metal electrolyte 104 may include: immersing the patterned first metallization layer 102 in an immersion bath containing the metal electrolyte 104, as shown in FIG. 1C.

In one or more embodiments, the metal electrolyte 104, e.g. the immersion bath containing the metal electrolyte 104, may be contained in a container or vessel 105, as shown in FIG. 1C.

In one or more embodiments, immersing the patterned first metallization layer 102 in the immersion bath may include immersing the semiconductor workpiece 101 in the immersion bath, as shown in FIG. 1C.

In one or more embodiments, the immersion bath may further include a chemically reducing agent such as, for example, methanal, formic acid, hypophosphite, hydrogen phosphite, DMAB (dimethylaminoborane), hydrazine, or the like. The chemically reducing agent may serve as an electron source.

In one or more embodiments, the immersion bath (e.g., the immersion bath containing a chemically reducing agent) may be configured as an autocatalytic bath.

In one or more embodiments, the first metallization layer 102 and the second metallization layer 103 may include different materials.

In one or more embodiments, the first metallization layer 102 may be configured as a solder interface.

In one or more embodiments, the first metallization layer 102 may include a solderable material, e.g. a solderable metal or metal alloy.

In one or more embodiments, the first metallization layer 102 may include at least one material selected from a group of materials, the group consisting as an example of: nickel (Ni), nickel vanadium (NiV), nickel phosphorus (NiP), titanium (Ti), titanium tungsten (TiW), copper (Cu).

In one or more embodiments, the second metallization layer 103 may be configured as a solder interface and/or as a protection layer (e.g., against corrosion, contamination, and/or the like).

In one or more embodiments, the second metallization layer 103 may include a noble metal.

In one or more embodiments, the second metallization layer 103 may include at least one material selected from a group of materials, the group consisting of: gold (Au), silver (Ag), palladium (Pd).

In one or more embodiments, the second metallization layer 103 may have a thickness in the range from about 5 nm to about 5 μm, e.g. in the range from about 5 nm to about 1 μm, e.g. a thickness of about 50 nm, although other thicknesses may be possible as well.

In one or more embodiments, the metal electrolyte 104 may include a noble metal electrolyte.

In one or more embodiments, the metal electrolyte 104 may include at least one electrolyte selected from a group of electrolytes, the group consisting of: a gold electrolyte, a silver electrolyte, a palladium electrolyte, a platinum electrolyte, a chromium electrolyte, a cobalt electrolyte.

In one or more embodiments, depositing the second metallization layer 103 over the patterned first metallization layer 102 may include covering at least one sidewall 102b of the patterned first metallization layer 102, as shown in FIG. 1C In one or more embodiments, depositing the second metallization layer 103 over the patterned first metallization layer 102 may include covering a top side 102a and sidewalls 102b of the patterned first metallization layer 102, as shown in FIG. 1C In one or more embodiments, depositing the second metallization layer 103 over the patterned first metallization layer 102 may include encapsulating the first metallization layer 102 with the second metallization layer 103.

In one or more embodiments, patterning the first metallization layer 102 may include etching the first metallization layer 102.

In one or more embodiments, etching the first metallization layer 102 may include wet-chemically etching the first metallization layer 102.

In one or more embodiments, etching the first metallization layer 102 may include dry etching the first metallization layer 102.

In one or more embodiments, the method may further include depositing a third metallization layer over the semiconductor workpiece 101 (not shown, see, e.g., FIG. 4B) and patterning the third metallization layer, wherein depositing the first metallization layer 102 over the semiconductor workpiece 101 includes depositing the first metallization layer 101 over the third metallization layer.

In one or more embodiments, the first metallization layer 101 and the third metallization layer may include different materials.

In one or more embodiments, the third metallization layer may be configured as a bather layer, e.g. a diffusion bather layer, and/or an adhesion layer.

In one or more embodiments, the third metallization layer may include at least one material selected from a group of materials, the group consisting of: titanium (Ti), titanium tungsten (TiW), chromium (Cr), tantalum, titanium nitride (TiN), tantalum nitride (TaN), aluminum, an alloy comprising aluminum.

In one or more embodiments, depositing the third metallization layer may include a vapor deposition process.

In one or more embodiments, the vapor deposition process may include at least one of the following: a physical vapor deposition process (e.g., a sputter deposition process, an evaporation process, or the like), a chemical vapor deposition process.

In accordance with other embodiments, other deposition processes may be applied to deposit the third metallization layer, for example an electrochemical deposition process or plating process.

In one or more embodiments, the third metallization layer may have a thickness in the range from about 5 nm to about 1 μm, e.g. in the range from about 50 nm to about 500 nm, e.g. a thickness of about 100 nm, although thicknesses may be possible as well.

In one or more embodiments, patterning the third metallization layer may include patterning the third metallization layer after patterning the first metallization layer 102 and before depositing the second metallization layer 103.

In one or more embodiments, patterning the third metallization layer may include etching the third metallization layer.

In one or more embodiments, etching the third metallization layer may include wet-chemically etching the third metallization layer.

In one or more embodiments, wet-chemically etching the first and third metallization layers may include wet-chemically etching the first and third metallization layers using different etch-chemistries. For example, wet-chemically etching the first metallization layer may be carried out using a first etchant (e.g., a first etching solution), while wet-chemically etching the second metallization layer may be carried out using a second etchant (e.g., a second etching solution) that is different from the first etchant.

In one or more embodiments, wet-chemically etching the first and third metallization layers may result in a metallization stack with no or substantially no undercut. In other words, edges or sidewalls of the etched first and third metallization layers may be flush or substantially flush with one another.

In one or more embodiments, etching the third metallization layer may include dry etching the third metallization layer.

In one or more embodiments, depositing the second metallization layer 103 may further include covering at least one sidewall of the patterned third metallization layer.

In one or more embodiments, depositing the second metallization layer 103 may further include covering sidewalls of the patterned third metallization layer.

In one or more embodiments, the semiconductor workpiece 101 may include a wafer, e.g. a silicon wafer, although other types of wafers may be used as well.

In one or more embodiments, depositing the first metallization layer 102 over the semiconductor workpiece 101 may include depositing the first metallization layer 101 over a front side of the semiconductor workpiece 101, e.g. over a wafer front side.

In one or more embodiments, depositing the first metallization layer 102 over the semiconductor workpiece 101 may include depositing the first metallization layer 101 over a back side of the semiconductor workpiece 101, e.g. over a wafer back side.

In one or more embodiments, depositing the first metallization layer 102 over the semiconductor workpiece 101 may include depositing the first metallization layer 101 over a front side and a back side of the semiconductor workpiece 101, e.g. over a wafer front side and a wafer back side.

In one or more embodiments, the semiconductor workpiece 101 may include an electrically conductive area, e.g. a contact pad, wherein depositing the first metallization layer 102 over the semiconductor workpiece 101 may include depositing the first metallization layer 102 over the electrically conductive area, e.g. contact pad.

In one or more embodiments, the patterned first metallization layer 102 may be in contact with the electrically conductive area, e.g. contact pad.

In one or more embodiments, depositing the third metallization layer over the semiconductor workpiece 101 may include depositing the third metallization layer over the electrically conductive area, e.g. contact pad.

In one or more embodiments, the patterned third metallization layer may be in contact with the electrically conductive area, e.g. contact pad.

In one or more embodiments, the electrically conductive area, e.g. contact pad, may include an electrically conductive material, e.g. at least one material selected from a group of materials, the group consisting of: copper, aluminum, an alloy containing at least one of aluminum and copper (e.g. AlCu, AlSiCu, CuAl).

In one or more embodiments, the semiconductor workpiece, e.g. wafer, may include at least one electrical or electronic device (e.g., diode, transistor, thyristor, or the like) that may be electrically coupled to the electrically conductive area (e.g. contact pad), e.g. via one or more interconnects, vias, or the like. The electrically conductive area (e.g. contact pad) may be coupled to an electrical terminal of the electrical or electronic device, e.g. to a gate terminal, a source terminal or a drain terminal of a transistor, as an example.

In one or more embodiments, the semiconductor workpiece 101 may include an electrically insulating area, wherein depositing the first metallization layer 102 over the semiconductor workpiece 101 may include depositing the first metallization layer 102 over the electrically insulating area.

In one or more embodiments, the patterned first metallization layer 102 may be disposed over the electrically insulating area.

In one or more embodiments, depositing the third metallization layer over the semiconductor workpiece 101 may include depositing the third metallization layer over the electrically insulating area.

In one or more embodiments, the patterned third metallization layer may be disposed over the electrically insulating area.

In one or more embodiments, the electrically insulating area may include an electrically insulating material such as, e.g., an oxide, a nitride, an oxynitride, or the like.

Figure 2:
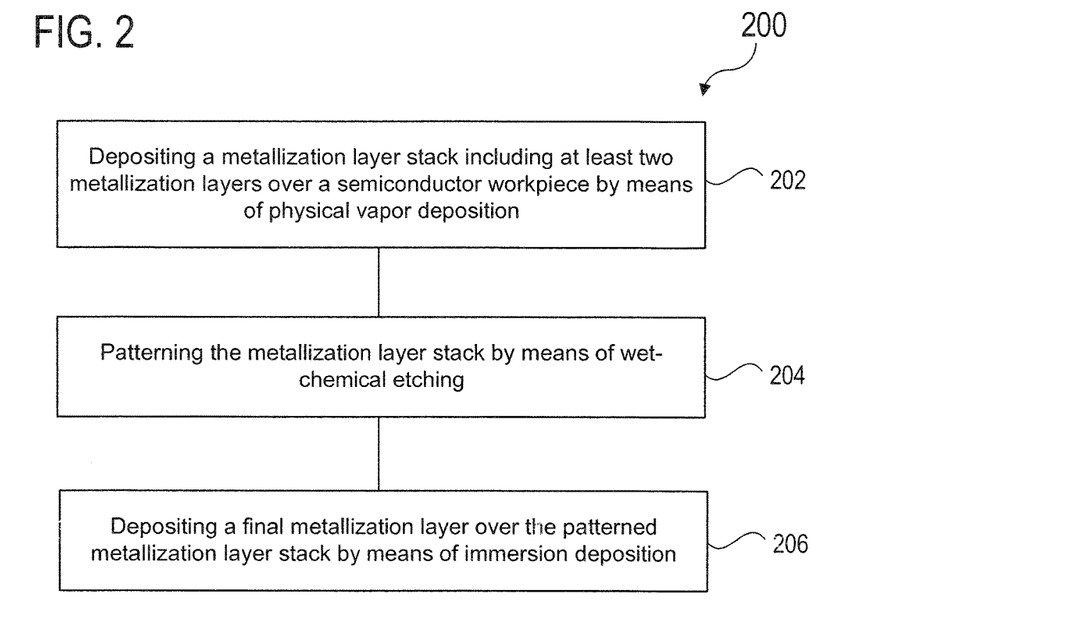
FIG. 2 illustrates a method for processing a semiconductor workpiece in accordance with various embodiments.

FIG. 2 illustrates a method 200 for processing a semiconductor workpiece in accordance with various embodiments.

Method 200 may include: depositing a metallization layer stack including at least two metallization layers over a semiconductor workpiece by means of physical vapor deposition (in 202); patterning the metallization layer stack by means of wet-chemical etching (in 204); and depositing a final metallization layer over the patterned metallization layer stack by means of immersion deposition (in 206).

In one or more embodiments, the final metallization layer may encapsulate the patterned metallization layer stack.

In one or more embodiments, patterning the metallization layer stack by means of wet-chemical etching may include etching the metallization layers of the stack using different etch chemistries.

In one or more embodiments, the final metallization layer may include a noble metal, e.g. gold, silver, or palladium.

Method 200 may be further configured in accordance with one or more embodiments described herein.

Figure 3:
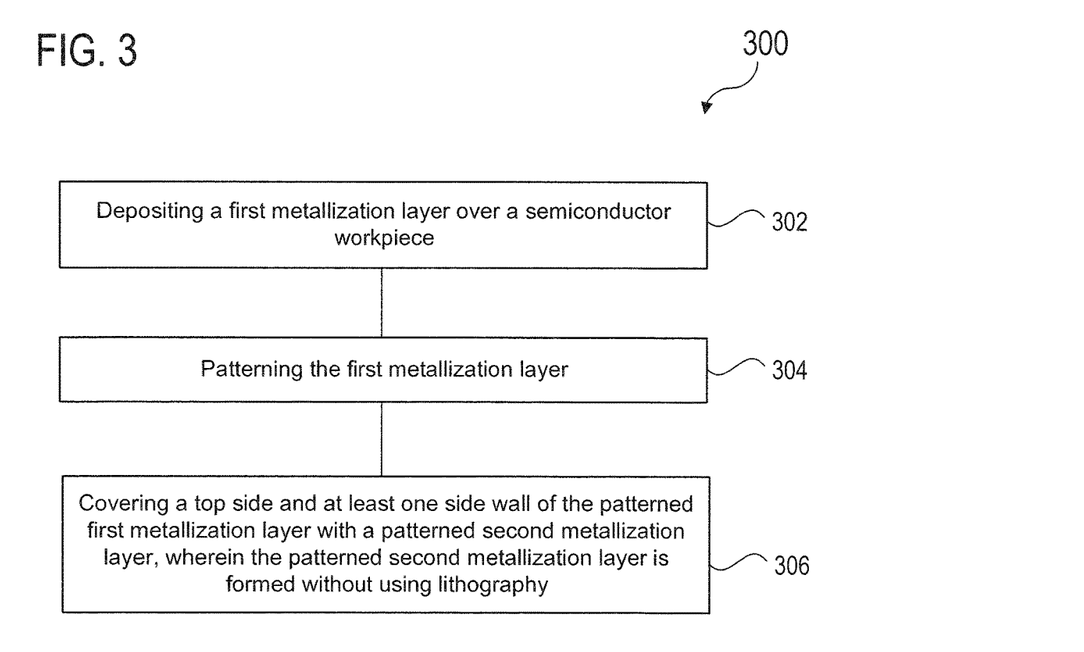
FIG. 3 illustrates a method for processing a semiconductor workpiece in accordance with various embodiments.

FIG. 3 illustrates a method 300 for processing a semiconductor workpiece in accordance with various embodiments.

Method 300 may include: depositing a first metallization layer over a semiconductor workpiece (in 302); patterning the first metallization layer (in 304); and covering a top side and at least one sidewall of the patterned first metallization layer with a patterned second metallization layer, wherein the patterned second metallization layer is formed without using lithography (in 306).

In one or more embodiments, the patterned second metallization layer is formed by means of electroless deposition in an immersion bath containing a metal electrolyte. In one or more embodiments, the immersion bath may be configured as an autocatalytic bath, containing e.g. a chemically reducing agent.

Method 300 may be further configured in accordance with one or more embodiments described herein.

FIG. 4A to 4I illustrate a method for processing a semiconductor workpiece in accordance with various embodiments.

Figure 4A:
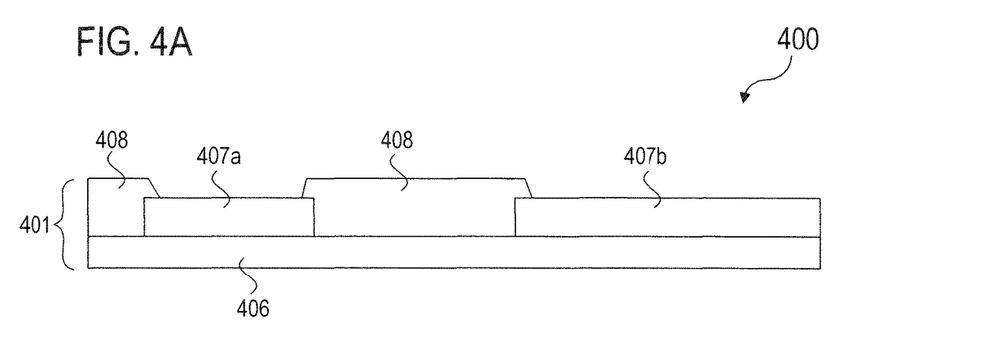
FIG. 4A to 4I illustrate a method for processing a semiconductor workpiece in accordance with various embodiments.

FIG. 4A shows, in a cross-sectional view 400, that a semiconductor workpiece 401 may be provided. In accordance with an embodiment, the workpiece 401 may be a wafer, for example a silicon or silicon based wafer, although other types of wafers may be possible as well, e.g. silicon carbide, silicon germanium, germanium, or the like.

The workpiece 401 may include a first insulating layer 406, for example an oxide layer, e.g. silicon oxide layer, or the like. The first insulating layer 406 may be disposed over one or more other layers of the workpiece 401 (not shown in the figures). In accordance with an embodiment, the first insulating layer 406 may be located at a front side of the workpiece 401, e.g. at a wafer front side.

The workpiece 401 may further include at least one electrically conductive area 407a, 407b disposed over the first insulating layer 406, for example a first electrically conductive area 407a and a second electrically conductive area 407b, as shown. In accordance with an embodiment, the first electrically conductive area 407a may include a first metallization area, for example a first contact pad, and the second electrically conductive area 407b may include a second metallization area, for example a second contact pad.

For example, in accordance with an embodiment, the first electrically conductive area 407a may include a gate contact pad and the second electrically conductive area 407b may include a source/drain contact pad, e.g. a source contact pad, which may, for example, contain aluminum or copper, or an alloy containing aluminum and/or copper, e.g. AlCu, AlSiCu, or the like.

The workpiece 401 may further include a second insulating layer 408 disposed over the first insulating layer 406 and at least partially between the first and second electrically conductive areas 407a, 407b. In accordance with an embodiment, the second insulating layer 408 may overlap or cover a portion of the first electrically conductive area 407a and/or a portion of the second electrically conductive area 407b, as shown. In accordance with an embodiment, the second insulating layer 408 may be configured as an adhesion and/or passivation layer. In accordance with an embodiment, the second insulating layer 408 may include an imide material or the like.

Figure 4B:
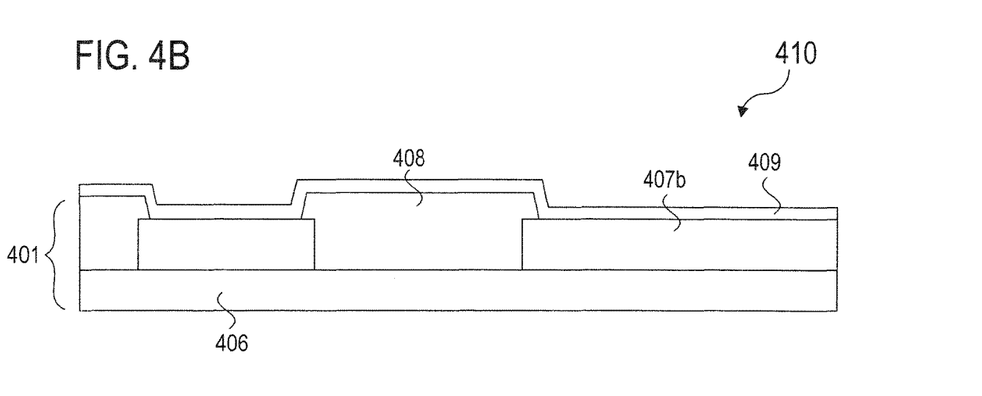

FIG. 4B shows, in a cross-sectional view 410, that a metallization layer 409 may be deposited over the workpiece 401, for example over the first and second electrically conductive areas 407a, 407b and the second insulating layer 408, as shown. The metallization layer 409 may correspond to the third metallization layer described herein above in connection with FIG. 1A to 1C.

In accordance with an embodiment, the metallization layer 409 may be deposited by means of a physical vapor deposition (PVD) process, e.g. a sputtering process or an evaporation process. In accordance with an embodiment, the metallization layer 409 may be configured as a diffusion bather. For example, the metallization layer 409 may include a bather layer material such as, for example, titanium (Ti), titanium tungsten (TiW), chromium (Cr), or the like.

The metallization layer 409 may, for example, have a thickness in the range from about 5 nm to about 1 µm, e.g. about 50 nm to about 500 nm, e.g. about 100 nm, although other thicknesses may be possible as well.

Figure 4C:
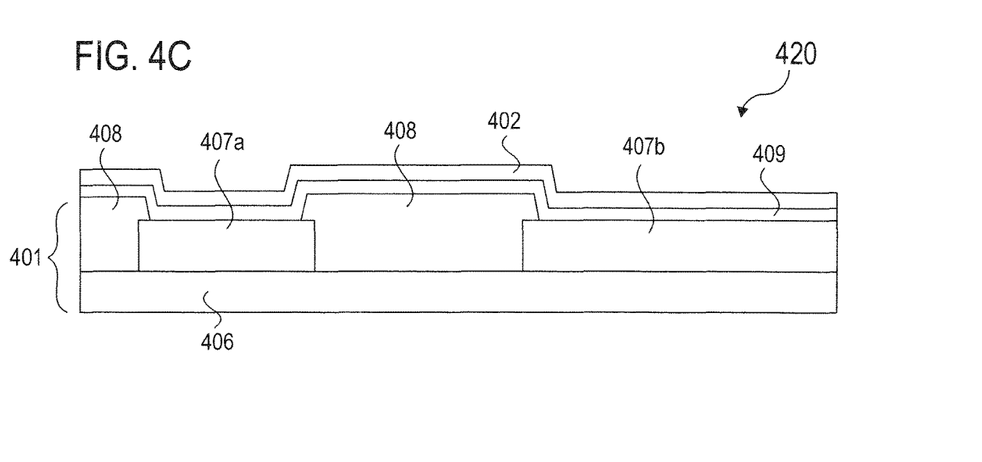

FIG. 4C shows, in a cross-sectional view 420, that a metallization layer 402 may be deposited over the metallization layer 409. The metallization layer 402 may correspond to the first metallization layer 102 described herein above in connection with FIG. 1A to 1C.

In accordance with an embodiment, the metallization layer 402 may be deposited by means of a physical vapor deposition (PVD) process, e.g. a sputtering process or an evaporation process. In accordance with other embodiments, the metallization layer 402 may be deposited by a chemical vapor deposition (CVD) process or an electrochemical deposition process or plating process. In accordance with an embodiment, the metallization layer 402 may be configured as a solder interface. For example, the metallization layer 402 may include a solderable metal or metal alloy such as, for example, nickel (Ni), nickel vanadium (NiV), or the like.

The metallization layer 402 may, for example, have a thickness in the range from about 5 nm to about 200 µm, e.g. about 50 nm to about 100 µm, e.g. about 500 nm, although other thicknesses may be possible as well.

The metallization layer stack 409/402 including the metallization layers 409 and 402 may be patterned, for example by means of photolithography, as will be described herein below with reference to FIG. 4D to 4H.

Figure 4D:
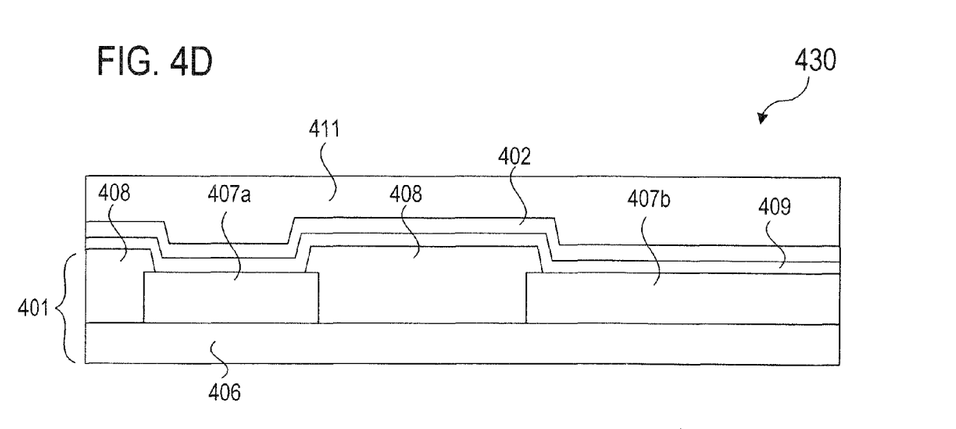

FIG. 4D shows, in a cross-sectional view 430, that a mask layer 411 may be deposited over the metallization layer 402. In accordance with an embodiment, the mask layer 411 may include a photo resist, e.g. a positive photo resist or a negative photo resist.

Figure 4E:
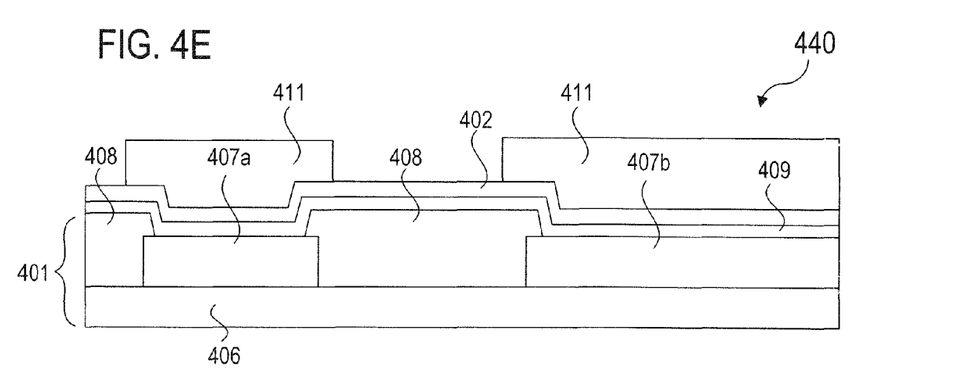

FIG. 4E shows, in a cross-sectional view 440, that the mask layer 411 may be patterned, for example by means of exposure and development in case of a photo resist. In accordance with an embodiment, the patterned mask layer 411 (e.g., patterned photo resist) may cover portions of the metallization layer stack 409/402 that correspond to (e.g., are disposed over) the at least one electrically conductive area 407a, 407b while exposing remaining portions of the metallization layer stack 409/402.

Figure 4F:
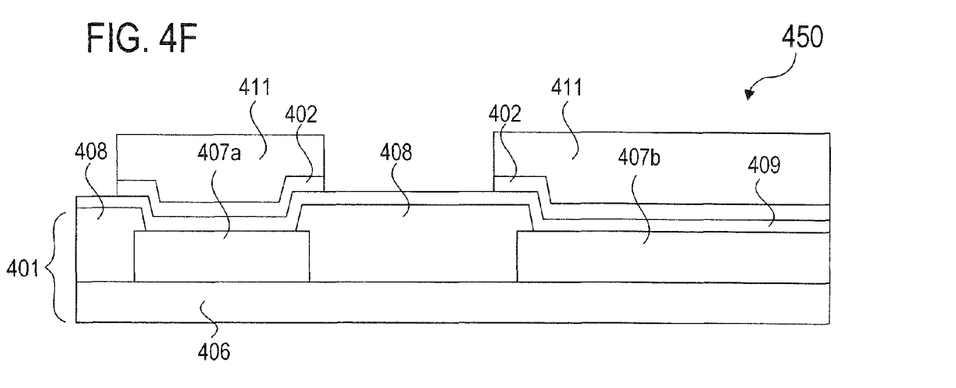

FIG. 4F shows, in a cross-sectional view 450, that the metallization layer 402 may be etched using the patterned mask layer 411 as an etch mask. In accordance with an embodiment, the metallization layer 402 may be etched by means of a wet-chemical etch process using a first etching chemistry, e.g. a first etchant, e.g. a first etching solution. In accordance with an embodiment, etching of the metallization layer 402 may terminate at the metallization layer 409 located below. That is, by etching the metallization layer 402 one or more portions of the metallization layer 409 may be exposed.

Figure 4G:
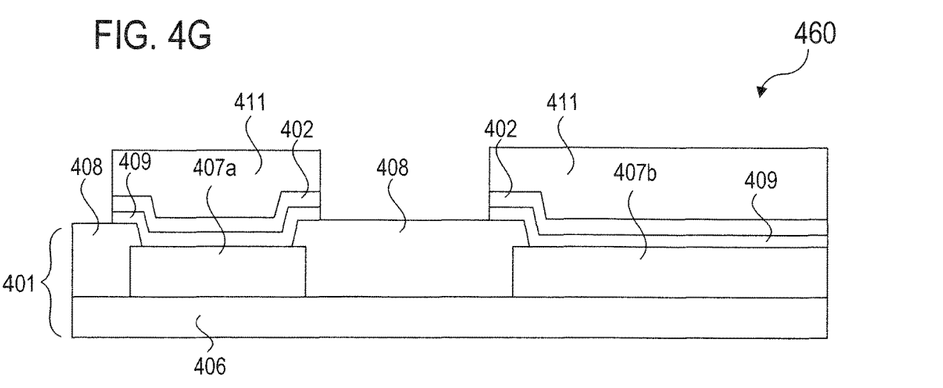

FIG. 4G shows, in a cross-sectional view 460, that the metallization layer 409 may be etched using the patterned mask layer 411 as an etch mask. In accordance with an embodiment, the metallization layer 409 may be etched by means of a wet-chemical etch process using a second etching chemistry, e.g. a second etchant, e.g. a second etching solution. In accordance with an embodiment, the second etching chemistry, e.g. the second etchant, e.g. the second etching solution, may be different from the first etching chemistry, e.g. the first etchant, e.g. the first etching solution. In accordance with an embodiment, etching of the metallization layer 409 may terminate at the second insulation layer 408 located below. That is, by etching the metallization layer 409 one or more portions of the second insulating layer 408 may be exposed.

Figure 4H:
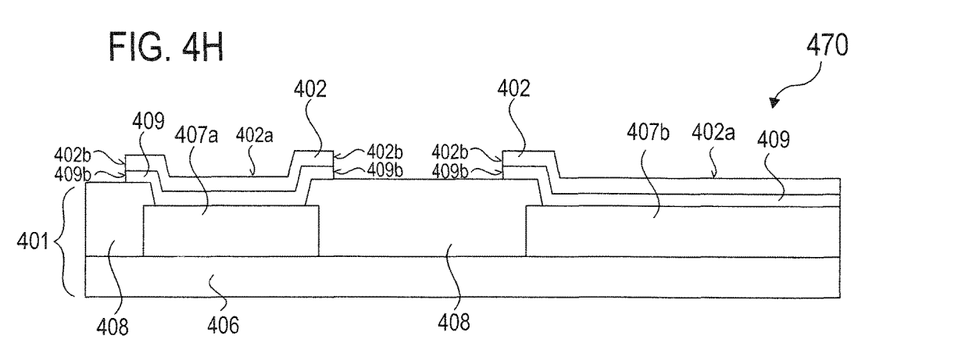

FIG. 4H shows, in a cross-sectional view 470, that the patterned mask layer 411 may be removed, for example by means of a stripping process in case a photo resist is used as the mask layer 411, alternatively by other suitable processes, which may be known as such in the art. Thus, a patterned metallization layer stack 409/402 may be obtained including the patterned metallization layer 409 having one or more exposed sidewalls 409b and the patterned metallization layer 402 having an exposed top side 402a and one or more exposed sidewalls 402b, as shown. In one or more embodiments, the metallization layer stack 409/402 may be free or substantially free from an undercut. In other words, the sidewall(s) 402b of the metallization layer 402 may be flush or substantially flush with the sidewall(s) 409b of the metallization layer 409. This may, for example, be achieved by using appropriate etch chemistries in the wet-chemical etching of the metallization layers 402, 409.

Figure 4I:
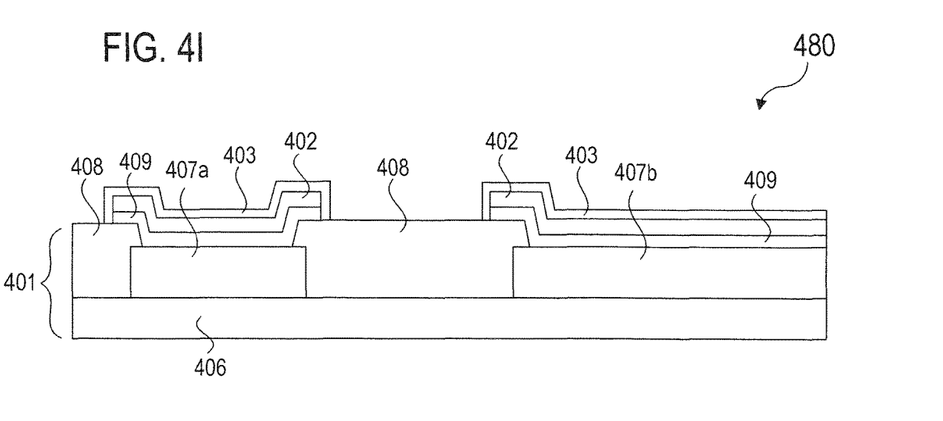

FIG. 4I shows, in a cross-sectional view 480, that a metallization layer 403 may be deposited over the metallization layer stack 409/402 including the patterned metallization layers 409 and 402. The metallization layer 403 may correspond to the second metallization layer 103 described herein above in connection with FIG. 1A to 1C.

The metallization layer 403 may be deposited by means of an electroless deposition process including immersing the metallization layer stack 409/402 in a metal electrolyte (not shown, see FIG. 1C). For example, in accordance with an embodiment, the deposition process may be a gold (Au) immersion process including immersing the metallization layer stack 409/402 in an immersion bath containing a gold electrolyte, thereby depositing a gold layer over the metallization layer stack 409/402, for example over the exposed top side 402a and the one or more exposed sidewalls 402b of the metallization layer 402 and over the one or more exposed sidewalls 409b of the metallization layer 409. In accordance with an embodiment, the immersion bath may include a chemically reducing agent in addition to the metal electrolyte. Thus, the immersion bath may be configured as an autocatalytic bath. By means of the immersion deposition process, the metallization layer 403 may be selectively deposited over the metallization layer stack 409/402. For example, the metallization layer 403 may selectively grow on the exposed areas of the metallization layers 402, 409. In accordance with an embodiment, the metallization layer 403 may be configured as a solder interface and/or protection layer.

The metallization layer 403 may, for example, have a thickness in the range from about 5 nm to about 5 µm, e.g. about 5 nm to about 1 µm, e.g. about 50 nm, although other thicknesses may be possible as well.

Thus, a structured solderable surface may be obtained via a combined etch (e.g., wet-etch) and immersion process. Since the metallization layer 403, e.g. a final gold metallization layer, is deposited via an immersion deposition process, additional patterning, e.g. by means of photolithography, of the metallization layer 403 may not be required.

As may be seen in FIG. 4I, the metallization layer 403 may grow over exposed surfaces of the metallization layer stack 409/402, including, e.g., one or more sidewalls of the layers that constitute the stack. Thus, in one or more embodiments, the metallization layer 403 may encapsulate the metallization layer stack 409/402.

Thus, a semiconductor workpiece in accordance with various embodiments may include: a patterned first metallization layer (e.g., layer 102 in FIG. 1C, or layer 402 in FIG. 4I); and a second metallization layer (e.g., layer 103 in FIG. 1C, or layer 403 in FIG. 4I) covering a top side and at least one sidewall of the patterned first metallization layer, wherein the second metallization layer is formed by means of an electroless deposition process including immersing the patterned first metallization layer in a metal electrolyte.

In one or more embodiments, the patterned first metallization layer may be disposed over a patterned third metallization layer (e.g., layer 409 in FIG. 4I), wherein the second metallization layer covers at least one sidewall of the patterned third metallization layer.

In one or more embodiments, the semiconductor workpiece may include a contact pad, wherein the patterned first metallization layer (or the patterned third metallization layer) may be disposed over the contact pad.

The semiconductor workpiece may further be configured in accordance with one or more embodiments described herein.

Various embodiments provide a new, inexpensive method of patterning a multilayer metallization, e.g. a multilayer metallization with a final gold (Au) layer, e.g. a Ti/NiV/Au based stack metallization in accordance with some embodiments.

In accordance with various embodiments, benefits of two different deposition methods may be combined when forming a metallization stack (e.g., a pad metallization stack). In particular, physical vapor deposition (PVD) and electroless processes may be combined to provide bondable, solderable and sinterable surfaces with a high degree of uniformity and low surface roughness for semiconductors. Besides, the proposed process may allow producing a patterned noble metal layer that may encapsulate a metal stack while the "patterning" may not need any additional process step. For example, the noble metal layer may be patterned without using lithography or lift-off processes.

In one or more embodiments, a bather layer (e.g., a Ti layer) and a solder interface layer (e.g., a NiV layer) may be deposited via sputtering which may result in uniform, smooth surfaces. These two layers may be wet-chemically etched with different chemistries and may result in a pad metallization without undercut at the pad edge. A final noble metallization may be deposited via an immersion process. Thus, the final metallization may be deposited without further lithography and may allow an encasement of the solder interface layer (e.g., NiV layer) at the pad edge. Furthermore, no aggressive chemistry may be needed to pattern the noble metallization. In one or more embodiments, the noble metallization may be a gold (Au) metallization. A final Au metallization may enable adhesion of sinter pastes at higher temperatures (compared, e.g., to the case, where silver (Ag) is used as final metallization layer).

In one or more embodiments, the proposed process flow can be applied as a double sided process, wherein two sides of a semiconductor workpiece, e.g. two opposite sides of the semiconductor workpiece, e.g. a wafer front side and back side, may be ennobled (e.g., gilded) in one process step. In one or more embodiments, the proposed process can be applied on Cu and Al pads. The new metallization stack may also allow wire bonding. In one or more embodiments, a simultaneous wet chemical patterning on both sides of the semiconductor workpiece may be carried out. In this case, the front side and the back side may have the same metallization stack, and the process chemicals used may be selective to the metals used on one side.

In accordance with various embodiments, a method for processing a semiconductor workpiece may include: depositing a first metallization layer over a semiconductor workpiece; applying a wet-chemical etch process to form a patterned metallization layer from the first metallization layer; and selectively depositing a second metallization layer over a top side and at least one sidewall of the patterned metallization layer by means of electroless immersion deposition.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a semiconductor workpiece, comprising:

depositing a first metallization layer over a semiconductor workpiece;
patterning the first metallization layer;
depositing a third metallization layer over the semiconductor workpiece and patterning the third metallization layer, wherein depositing the first metallization layer over the semiconductor workpiece comprises depositing the first metallization layer over the third metallization layer; and
depositing a second metallization layer over the patterned first metallization layer, wherein depositing the second metallization layer comprises an electroless deposition process comprising immersing the patterned first metallization layer in a metal electrolyte, wherein the second metallization layer is not subsequently patterned after deposition;
wherein depositing the second metallization layer over the patterned first metallization layer comprises covering a top side and all sidewalls of the patterned first metallization layer and all sidewalls of the patterned third metallization layer with the second metallization layer, and
wherein the semiconductor workpiece comprises an electrically conductive area and the third metallization layer is deposited directly on the electrically conductive area,
wherein the second metallization layer is a final metallization layer comprising gold, and the first metallization layer comprises nickel vanadium, and the third metallization layer comprises titanium.

2. The method of claim 1, wherein depositing the first metallization layer comprises a physical vapor deposition process.

3. The method of claim 1, wherein immersing the patterned first metallization layer in a metal electrolyte comprises:
immersing the patterned first metallization layer in an immersion bath comprising the metal electrolyte.

4. The method of claim 3, wherein the immersion bath further comprises a chemically reducing agent.

5. The method of claim 1, wherein patterning the first metallization layer comprises etching the first metallization layer.

6. The method of claim 5, wherein etching the first metallization layer comprises wet-chemically etching the first metallization layer.

7. The method of claim 1, wherein depositing the third metallization layer comprises a physical vapor deposition process.

8. The method of claim 1, wherein patterning the third metallization layer comprises patterning the third metallization layer after patterning the first metallization layer and before depositing the second metallization layer.

9. The method of claim 1, wherein patterning the third metallization layer comprises etching the third metallization layer.

10. The method of claim 9, wherein etching the third metallization layer comprises wet-chemically etching the third metallization layer.

11. The method of claim 1, further comprising:
at least one of sintering, soldering, or bonding with the second metallization layer.

12. The method of claim 1, further comprising:
wherein the semiconductor workpiece comprises a first insulating layer so that the electrically conductive area is disposed directly on the first insulating layer.

13. The method of claim 12, further comprising:
wherein the semiconductor workpiece comprises a second insulating layer disposed adjacent to and partially on the electrically conductive area and directly on the first insulating layer,
wherein a portion of the first, second, and third metallization layers overhang a portion of the second insulating layer.

14. The method of claim 13, wherein a portion of the second metallization layer and a portion of the third metallization layer contact the second insulating layer.

15. The method of claim 13, wherein the surface of the second insulating layer facing away from the first insulating is higher than a surface of the electrically conductive layer facing away.

16. The method of claim 1, wherein the electrically conductive layer is a contact pad.

17. A semiconductor workpiece, comprising:
a patterned third metallization layer disposed directly on an electrically conductive area of the semiconductor workpiece;
a patterned first metallization layer disposed directly on the third metallization layer; and
a second metallization layer covering a top side and sidewalls of the patterned first metallization layer and further covering sidewalls of the third metallization layer,
wherein the second metallization layer is formed by means of an electroless deposition process comprising immersing the patterned first metallization layer in a metal electrolyte, and
wherein the second metallization layer is a final metallization layer comprising gold, and the first metallization layer comprises nickel vanadium, and the third metallization layer comprises titanium.

* * * * *